US009264045B2

(12) United States Patent
Vashishtha et al.

(10) Patent No.: US 9,264,045 B2
(45) Date of Patent: Feb. 16, 2016

(54) BUFFER CIRCUIT WITH REDUCED STATIC LEAKAGE THROUGH CONTROLLED BODY BIASING IN FDSOI TECHNOLOGY

(71) Applicant: STMicroelectronics International N.V., Amsterdam (NL)

(72) Inventors: Sameer Vashishtha, Greater Noida (IN); Saiyid Mohammad Irshad Rizvi, New Delhi (IN)

(73) Assignee: STMicroelectronics International N.V., Amsterdam (NL)

(*) Notice: Subject to any disclaimer, the term of this patent is extended or adjusted under 35 U.S.C. 154(b) by 86 days.

(21) Appl. No.: 14/231,939

(22) Filed: Apr. 1, 2014

(65) Prior Publication Data

US 2015/0280716 A1      Oct. 1, 2015

(51) Int. Cl.
*H03K 5/08* (2006.01)
*H03K 19/0948* (2006.01)
*H03K 19/003* (2006.01)
*H03K 19/0185* (2006.01)
*H03K 19/00* (2006.01)

(52) U.S. Cl.
CPC ...... *H03K 19/09487* (2013.01); *H03K 19/0027* (2013.01); *H03K 19/00361* (2013.01); *H03K 19/018521* (2013.01)

(58) Field of Classification Search
USPC ....................................................... 327/312
See application file for complete search history.

(56) References Cited

U.S. PATENT DOCUMENTS

| | | | |
|---|---|---|---|
| 5,200,921 A * | 4/1993 | Okajima | 365/189.11 |
| 5,422,591 A | 6/1995 | Rastegar et al. | |
| 5,644,266 A | 7/1997 | Chen et al. | |
| 6,304,110 B1 | 10/2001 | Hirano | |
| 6,404,243 B1 | 6/2002 | Koch, II et al. | |
| 7,847,616 B2 | 12/2010 | Hashimoto | |
| 2004/0108874 A1 * | 6/2004 | Erstad | 327/112 |

OTHER PUBLICATIONS

Jean-Luc Pelloie ,FDSOI Design Portability from BULK at 20nm Node, IEEE SOI, Oct. 4, 2011.*
Kader: "Advancement of CMOS Schmitt Trigger Circuits," Modern Applied Science, vol. 6, No. 12, 2012.
Nyathi: "A Tunable Body Biasing Scheme for Ultra-Low Power and High Speed CMOS Designs," IEEE Student Paper, pp. 1-11.
Roy: "Leakage Current Mechanisms and Leakage Reduction Techniques in Deep-Submicrometer CMOS Circuits," Proc. of the IEEE, vol. 91, No. 2, Feb. 2003.

(Continued)

*Primary Examiner* — Lincoln Donovan
*Assistant Examiner* — Patrick Chen
(74) *Attorney, Agent, or Firm* — Gardere Wynne Sewell LLP

(57) ABSTRACT

A buffer includes an input configured to receive a first digital signal having first and second logic states referenced, respectively, to a first high voltage and a first low voltage of a first supply domain. A first inverter circuit includes a pMOS transistor and nMOS transistor having gate terminals connected to the input. A second inverter is connected in series with the output of the first inverter. The second inverter has an output configured to generate a second digital signal having first and second logic states referenced, respectively, to a second high voltage and a second low voltage of a second, different, supply domain, wherein at least the second high voltage is greater than the first high voltage. A feedback circuit is configured to apply the second digital signal as a bias to a transistor body of the p-MOS transistor of the first inverter circuit.

14 Claims, 2 Drawing Sheets

(56) References Cited

OTHER PUBLICATIONS

Zhang: "Low Voltage CMOS Schmitt Trigger Circuits," Electronics Letters, vol. 39, No. 24, 2003.

Zhang: Techniques for Low Power Analog, Digital and Mixed Signal CMOS Integrated Circuit Design,: Ph.D. Dissertation, Louisiana State University, 2005 (179 pages).

* cited by examiner

BUFFER CIRCUIT WITH REDUCED STATIC LEAKAGE THROUGH CONTROLLED BODY BIASING IN FDSOI TECHNOLOGY

FIELD OF THE INVENTION

The present disclosure generally relates buffer circuits and, more particularly, to a buffer circuit with reduced static leakage.

BACKGROUND

Reference is made to FIG. 1 which illustrates a prior art buffer circuit 10 comprising a pair of series connected CMOS inverters 12. Each inverter 12 is formed of a p-channel MOSFET (pMOS) 14 having a source-drain path coupled in series with the source-drain path of an n-channel MOSFET (nMOS) 16. More particularly, the source terminal and transistor body (bulk or well) of the pMOS transistor 14 are coupled to a high supply node 18 and the source terminal and body (bulk or well) of the nMOS transistor 16 are coupled to a low supply node 20. The high and low supply nodes 18 and 20, respectively, receive high and low supply voltages associated with a supply voltage domain. For example, the high supply voltage, referred to as Vdd, may comprise 1.8 Volts and the low supply voltage, referred to as ground, may comprise 0 Volts. The gate terminals of the pMOS transistor 14 and nMOS transistor 16 are coupled together at an inverter input node 22. The drain terminals of the pMOS transistor 14 and nMOS transistor 16 are coupled together at an inverter output node 24. With the series connection of the CMOS inverters 12, the inverter output node 24 of a first one of the inverters is coupled to the inverter input node 22 of a second one of the inverters.

The operation of the inverters 12 is well known to those skilled in the art. In response to a logic high signal at the inverter input node 22, the pMOS transistor 14 is turned off and the nMOS transistor 16 is turned on. The inverter output node 24 is accordingly coupled to the low supply node 20 and the inverter outputs a logic low signal. Conversely, in response to a logic low signal at the inverter input node 22, the pMOS transistor 14 is turned on and the nMOS transistor 16 is turned off. The inverter output node 24 is accordingly coupled to the high supply node 18 and the inverter outputs a logic high signal. The back-to-back inversions provided by the series connected inverters 12 provide a signal buffering operation with the input signal IN and output signal OUT having a same logic state.

It is common for the supply range of the input signal IN to be the same as the supply range of the supply voltage domain for the circuit 10. In such scenarios, static leakage of the circuit 10 is well within specifications at all times because one of the pull up transistor or pull down transistor of each inverter will be completely turned off.

However, certain circumstances exist where the supply range of the input signal IN may be different from the supply range of the supply voltage domain for the circuit 10. A common situation is a buffering operation with respect to an input signal whose supply range is less than the supply range of the circuit 10. In such a scenario, there is a significant increase in static leakage because the logic high voltage of the input signal (at 1.2V, for example) is not sufficiently high enough to fully turn off the pMOS transistor 14 (referenced to Vdd=1.8V. for example).

To address the static leakage issue, a commonly used design solution is to reduce the strength of the pMOS transistor 14. This unfortunately has an adverse effect on the switching speed of the buffer circuit 10. Such a circuit would be suitable only for low speed applications. For high speed applications, another solution is needed.

There is accordingly a need in the art for a buffer circuit with reduced static current leakage which is suitable for high speed applications.

SUMMARY

In an embodiment, a circuit comprises: a first system including a drive circuit configured to generate a first digital signal having a first logic state and a second logic state referenced, respectively, to a first high voltage and a first low voltage of a first supply domain; a second system including a buffer circuit configured to receive the first digital signal and generate a second digital signal having a first logic state and a second logic state referenced, respectively, to a second high voltage and a second low voltage of a second supply domain; wherein the second high voltage is greater than the first high voltage, The buffer circuit comprises: a first inverter circuit including a p-channel MOSFET having a gate terminal configured to receive the first digital signal and a transistor body; a second inverter having an input coupled to an output of the first inverter circuit and having an output configured to generate the second digital signal; and a feedback circuit configured to apply the signal digital signal as a bias to the transistor body of the p-channel MOSFET of the first inverter circuit.

In an embodiment, a circuit comprises: a fully depleted silicon on insulator (FDSOI) substrate; a first inverter circuit implemented on said FDSOI substrate and including: a p-channel MOSFET having a gate terminal configured to receive a first digital signal and further having a transistor body; and an n-channel MOSFET having a gate terminal configured to receive the first digital signal and further having a transistor body connected to a source terminal of the n-channel MOSFET; a second inverter implemented on said FDSOI substrate and having an input coupled to an output of the first inverter circuit and having an output configured to generate a second digital signal; and a feedback circuit configured to apply the second digital signal as a bias to the transistor body of the p-channel MOSFET of the first inverter circuit.

In an embodiment, a circuit comprises: an input line configured to receive a first digital signal having a first logic state and a second logic state referenced, respectively, to a first high voltage and a first low voltage of a first supply domain; a first inverter circuit including: a p-channel MOSFET having a gate terminal connected to the input line, a source-drain path and a transistor body; and an n-channel MOSFET having a gate terminal connected to the input line, a source-drain path coupled in series with the source-drain path of the p-channel MOSFET and a transistor body connected to a source terminal of the n-channel MOSFET; a second inverter having an input coupled to an output of the first inverter circuit and having an output configured to generate a second digital signal having a first logic state and a second logic state referenced, respectively, to a second high voltage and a second low voltage of a second supply domain different from the first supply domain; an output line connected to the output of the second inverter; and a feedback circuit configured to apply the second digital signal as a bias to the transistor body of the p-channel MOSFET of the first inverter circuit.

The foregoing and other features and advantages of the present disclosure will become further apparent from the following detailed description of the embodiments, read in conjunction with the accompanying drawings. The detailed description and drawings are merely illustrative of the disclo-

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE DRAWINGS

Figure 2:
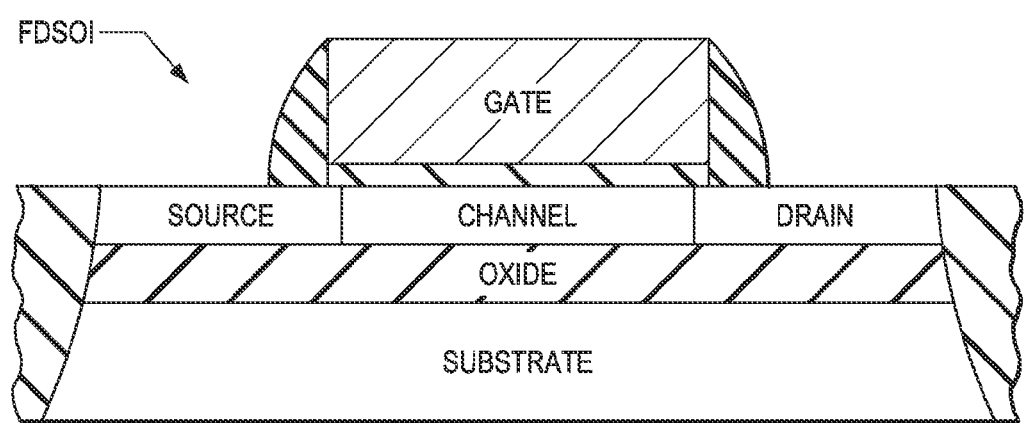
FIG. 2 is a cross-section of an exemplary FDSOI transistor.

Those skilled in the art are familiar with integrated circuits fabricated using fully depleted silicon on insulator (FDSOI) substrates. FIG. 2 illustrates a cross-section of an exemplary transistor implemented using an FDSOI substrate. Such substrates include a bottom support substrate, for example made of silicon, with an insulating layer, for example made of an oxide material, over the support substrate, and with a semiconductor layer over the oxide layer. The insulating layer is typically very thin and is often referred to as a buried oxide layer. The semiconductor layer is also very thin and is used to form the body, source, drain and channel regions of integrated transistor devices. The channel region in an FDSOI device differs from the channel region in conventional bulk transistor technologies in that there are no dopants present in the semiconductor material (i.e., it is fully depleted). The active region can be defined using trench isolation structures which penetrate through the semiconductor and buried oxide layers. Dopant implants for source and drain regions are then provided in the semiconductor layer. A gate stack (with gate conductor, gate dielectric and sidewall spacers) is provided over the fully depleted channel region. Although not shown in FIG. 2, the integrated circuit will further include a premetal dielectric layer over the FDSOI substrate with contacts passing there through for making electrical contact to the gate, body, source and drain regions. Further overlying metallization layers contain electric lines and vias for making electrical connections to and between the contacts.

Figure 3:
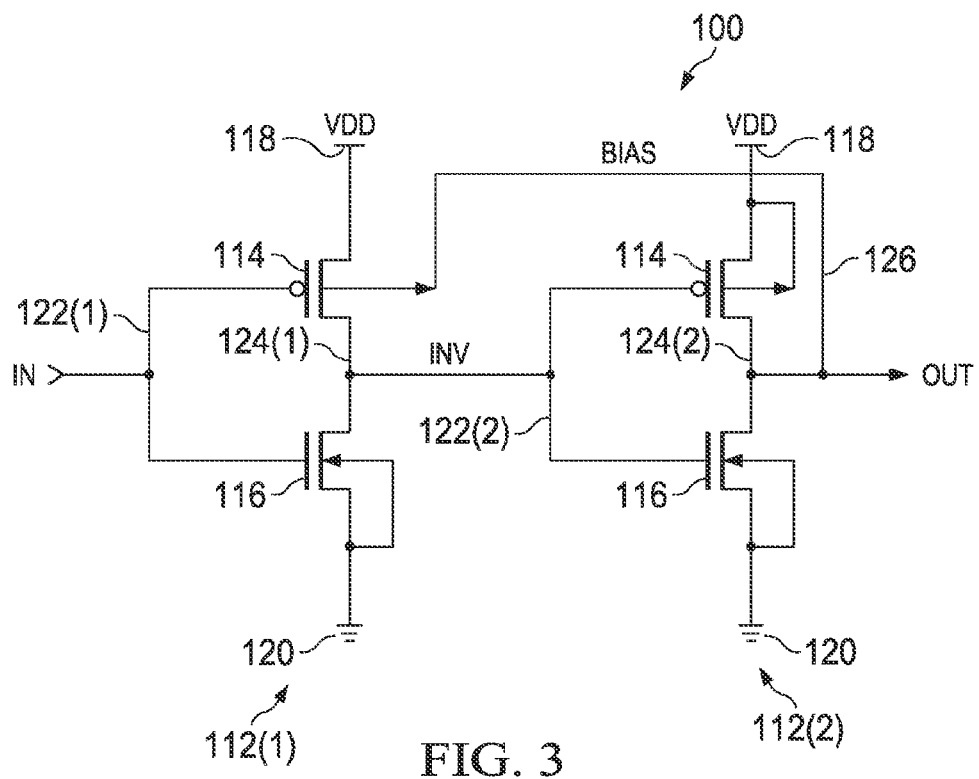
FIG. 3 is a circuit diagram of a buffer circuit in accordance with an embodiment.

Reference is now made to FIG. 3 which illustrates a circuit diagram of a buffer circuit 100 in accordance with an embodiment. The buffer circuit 100 comprises a pair of series connected inverters 112. In a preferred embodiment, each inverter 112 is a CMOS inverter formed of a p-channel MOSFET (pMOS) 114 having a source-drain path coupled in series with the source-drain path of an n-channel MOSFET (nMOS) 116. The transistors 112 and 114 are fabricated using a fully depleted silicon on insulator (FDSOI) substrate of the type described above and are implemented in a manner, for example, like that shown in FIG. 2. Thus, the source, drain, channel and body regions are provided in the fully depleted semiconductor layer and the active regions of the transistors are isolated from each other by the trench isolation structures.

The first inverter 112(1) is configured with the source terminal of its pMOS transistor 114 coupled to a high supply node 118 and the source terminal and transistor body of its nMOS transistor 116 coupled to a low supply node 120. The gate terminals of the pMOS transistor 114 and nMOS transistor 116 are coupled together at a first inverter input node 122(1) to receive a digital input signal N. The drain terminals of the pMOS transistor 114 and nMOS transistor 116 are coupled together at a first inverter output node 124(1) to generate an inverted digital signal INV.

The second inverter 112(2) is configured with the source terminal and transistor body of its pMOS transistor 114 coupled to the high supply node 118 and the source terminal and transistor body of its nMOS transistor 116 coupled to the low supply node 120. The gate terminals of the pMOS transistor 114 and nMOS transistor 116 are coupled together at a second inverter input node 122(2) to receive the inverted digital signal INV from the first inverter output node 124(1). The drain terminals of the pMOS transistor 114 and nMOS transistor 116 are coupled together at a second inverter output node 124(2) to generate an output digital signal OUT.

The transistor body of the pMOS transistor 114 of the first inverter 112(1) is coupled to the second inverter output node 124(2) via a feedback path 126 to pass a digital bias signal (BIAS) having a logic state and voltage level equal to the digital output signal OUT.

The high and low supply nodes 118 and 120, respectively, receive high and low supply voltages associated with a supply voltage domain. For example, the high supply voltage, which may be referred to as Vdd, may comprise 1.8 Volts and the low supply voltage, which may be referred to as ground, may comprise 0 Volts. Alternatively, the high supply voltage may be set at +Vdd and the low supply voltage may be set at —Vdd or some other reference voltage Vss. The inverted digital signal INV and the output digital signal OUT accordingly having logic states defined by the high and low supply voltages, respectively.

Figure 4:
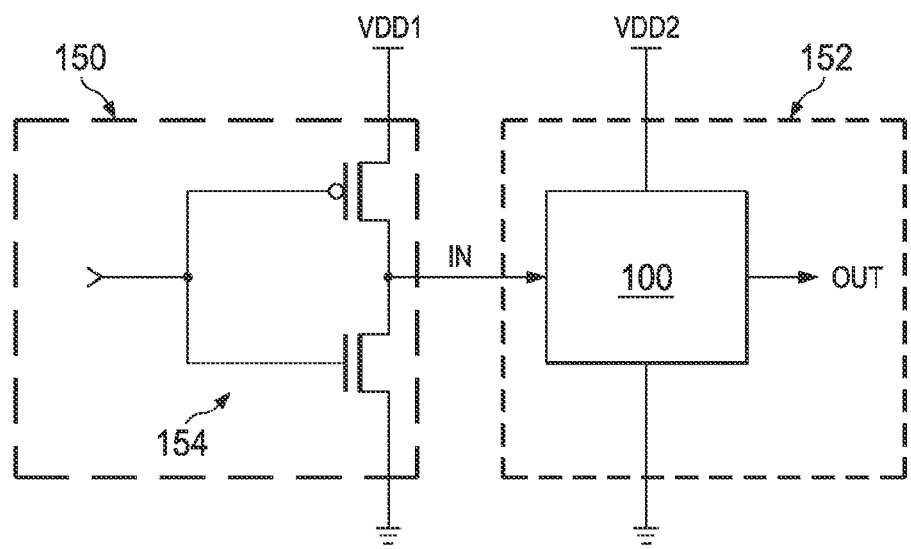
FIG. 4 is a block diagram of a system incorporating the buffer circuit of FIG. 2.

The circuit of FIG. 3 is advantageously implemented to provide for reduced static current operation in operating scenarios where the input digital signal IN is provided with reference to a different voltage domain than the supply voltage domain for the buffer 100. This circuit configuration is illustrated in FIG. 4. For example, the input digital signal IN may be generated in a first system 150 by a drive circuit 154 which has a voltage domain (supply range) referenced to a signal high voltage (Vdd1) for a logic 1 state and a signal low voltage (ground) for a logic 0 state, while the buffer 100 is provided in a second system 152 which has a voltage domain (supply range) referenced to a high supply voltage (Vdd2), that is greater than the signal high voltage (Vdd1), and a low supply voltage (ground). Thus, the input digital signal IN has logic states defined by the signal high and signal low voltages, respectively, with at least the high supply voltage (Vdd2) and signal high voltage (Vdd1) being different. For example, in an embodiment, the high supply voltage Vdd2 may be 1.8 Volts and the signal high voltage Vdd1 may be 1.2 Volts.

In this operating scenario, when the input digital signal IN rises to logic high at voltage 1.2V, this gate voltage on the pMOS transistor 114 of the first inverter 112(1) may be sufficient to flip the logic state of the first inverter 112(1) (and cause a further flip of the logic state of the second inverter 112(2)) but is insufficient, by itself, to fully turn off the pMOS transistor 114 whose source voltage is at the high supply voltage Vdd2 of 1.8 Volts. A leakage current could thus flow through the partially on pMOS transistor 114 of the first inverter 112(1) and the fully on nMOS transistor 116 of the second inverter 112(2). The output signal OUT, however, will be driven to logic high at the high supply voltage Vdd2 by the fully on pMOS transistor 114 of the second inverter 112(2). The digital BIAS signal, which equals the output digital signal OUT at the logic high state voltage Vdd2, is passed in the feedback path 126 from the second inverter output node 124(2) for application to the transistor body of the pMOS transistor 114 of the first inverter 112(1). The application of the high supply voltage Vdd2 to the transistor body of the pMOS transistor 114 of the first inverter 112(1) is sufficient to ensure that the pMOS transistor 114 is fully turned off. More specifically, the application of the BIAS signal at logic high (1.8V) causes an increase in the threshold voltage Vt of the transistor 114 of the first inverter 112(1). The change in the threshold voltage Vt results in a reduction of leakage current through transistor 114 of the first inverter 112(1).

Figure 1:
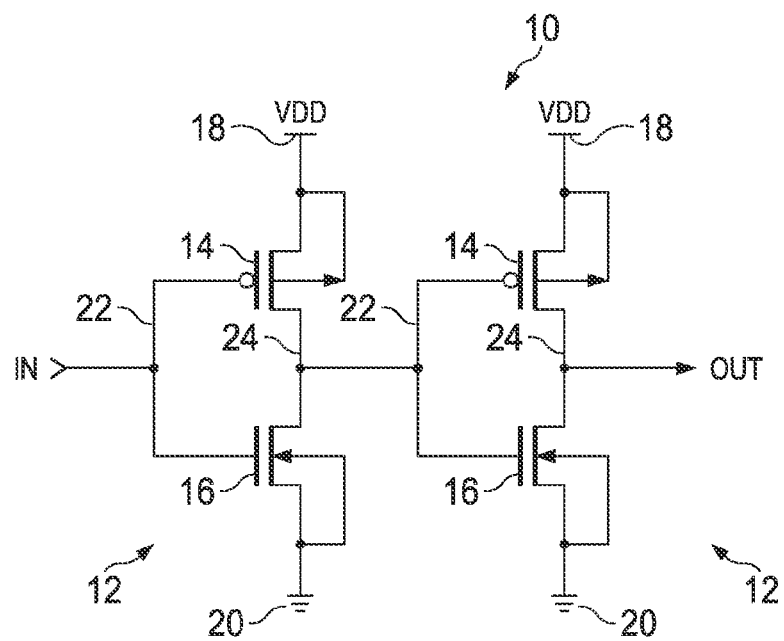
FIG. 1 is a circuit diagram of a conventional prior art buffer circuit formed by series connected CMOS inverters.

In comparison to the operation of the circuit of FIG. 1, the circuit of FIG. 3 exhibits a 90+% reduction in static leakage.

The first and second systems 150 and 152 may be located on a same integrated circuit chip, for example as operating domains of a system on chip supporting different supply domains. Alternatively, the first and second systems 150 and 152 may be located on different integrated circuit chips, for example as different components with different power supply domains that are interconnected with each other in a system.

Although two inverter circuits are illustrated for the buffer 100, it will be understood that the buffer may include more than two inverter circuits. In an embodiment, the buffer 100 may include n inverter circuits, wherein n is preferably an even integer greater than or equal to 2. Where n is greater than 2, the feedback bias signal BIAS should preferably be taken at the output of the second inverter is the series chain of n inverters, but it is noted that the feedback bias signal could alternatively be taken from the output of any included even-numbered inverter.

Although the output signal OUT is shown as being taken at the output of the second inverter, it will be understood than an inverting buffer circuit may be implemented with the output signal OUT instead being taken as the inverted signal INV.

Although the second inverter 112(2) is shown as a CMOS inverter, it will be understood that the second inverter 112(2) may alternatively comprise any suitable inverter circuitry and the illustration and use of a CMOS inverter is exemplary only.

In an embodiment, the pMOS transistor 114 may have a W=10u and L=150u, and the nMOS 116 may have a W=5u and L=150u.

It will be understood that the reference to a 1.2V domain and a 1.8V domain is exemplary only. Without limitation, it will be understood that that the circuit presented herein is useful when the voltage domain (supply range) for the first system 150 has a logic high voltage which is less than the logic high voltage of the voltage domain (supply range) for the second system 152. As another example, the voltage domain (supply range) for the first system 150 may have a logic high voltage at 1.8V and the voltage domain (supply range) for the second system 152 may have a logic high voltage of 2.5V.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a first system including a drive circuit configured to generate a first digital signal having a first logic state and a second logic state referenced, respectively, to a first high voltage and a first low voltage of a first supply domain;
   a second system including a buffer circuit configured to receive the first digital signal and generate a second digital signal having a first logic state and a second logic state referenced, respectively, to a second high voltage and a second low voltage of a second supply domain;
   wherein the second high voltage is greater than the first high voltage; and
   wherein the buffer circuit comprises:
      a first inverter circuit including a p-channel MOSFET having a gate terminal configured to receive the first digital signal and a transistor body;
      a second inverter having an input coupled to an output of the first inverter circuit and having an output configured to generate the second digital signal; and
      a feedback circuit configured to apply the output signal as a bias to the transistor body of the p-channel MOSFET of the first inverter circuit.

2. The circuit of claim 1, wherein the input of the second inverter is directly connected to the output of the first inverter and wherein the feedback circuit provides a direct connection of the output of the second inverter circuit to the transistor body of the p-channel MOSFET of the first inverter circuit.

3. The circuit of claim 1, wherein the first high voltage is about 1.2V and the second high voltage is about 1.8V.

4. The circuit of claim 1, wherein the first inverter circuit further comprises an n-channel MOSFET having a gate terminal configured to receive the first digital signal and a source terminal coupled to a transistor body of the n-channel MOSFET.

5. The circuit of claim 4, wherein source-drain paths of the p-channel and n-channel MOSFETs are connected in series at the output of the first inverter circuit.

6. The circuit of claim 1, wherein the buffer circuit is implemented on a fully depleted silicon on insulator (FDSOI) substrate.

7. A circuit, comprising:
   a fully depleted silicon on insulator (FDSOI) substrate;
   a first inverter circuit fabricated on said FDSOI substrate including:
      a p-channel MOSFET having a gate terminal configured to receive a first digital signal and further having a transistor body; and
      an n-channel MOSFET having a gate terminal configured to receive the first digital signal and further having a transistor body connected to a source terminal of the n-channel MOSFET;
   a second inverter fabricated on said FDSOI substrate and having an input coupled to an output of the first inverter circuit and having an output configured to generate a second digital signal; and
   a feedback circuit configured to apply the second digital signal as a bias to the transistor body of the p-channel MOSFET of the first inverter circuit;
   wherein the first digital signal has a first logic state and a second logic state referenced, respectively, to a first high voltage and a first low voltage of a first supply domain, wherein the second digital signal has a first logic state and a second logic state referenced, respectively, to a second high voltage and a second low voltage of a second supply domain, and wherein the second high voltage is greater than the first high voltage.

8. The circuit of claim 7, wherein source-drain paths of the p-channel and n-channel MOSFETs of the first inverter circuit are connected in series at the output of the first inverter circuit.

9. The circuit of claim 7, wherein the first high voltage is about 1.2V and the second high voltage is about 1.8V.

10. The circuit of claim 7, wherein the feedback circuit provides a direct connection of the output of the second inverter circuit to the transistor body of the p-channel MOSFET of the first inverter circuit.

11. A circuit, comprising:
an input line configured to receive a first digital signal having a first logic state and a second logic state referenced, respectively, to a first high voltage and a first low voltage of a first supply domain;
a first inverter circuit including:
a p-channel MOSFET having a gate terminal connected to the input line, a source-drain path and a transistor body; and
an n-channel MOSFET having a gate terminal connected to the input line, a source-drain path coupled in series with the source-drain path of the p-channel MOSFET and a transistor body connected to a source terminal of the n-channel MOSFET;
a second inverter having an input coupled to an output of the first inverter circuit and having an output configured to generate a second digital signal having a first logic state and a second logic state referenced, respectively, to a second high voltage and a second low voltage of a second supply domain different from the first supply domain, wherein the second high voltage is greater than the first high voltage;
an output line connected to the output of the second inverter; and
a feedback circuit configured to apply the second digital signal as a bias to the transistor body of the p-channel MOSFET of the first inverter circuit.

12. The circuit of claim 11, wherein the first high voltage is about 1.2V and the second high voltage is about 1.8V.

13. The circuit of claim 11, wherein the feedback circuit provides a direct connection of the output of the second inverter circuit to the transistor body of the p-channel MOSFET of the first inverter circuit.

14. The circuit of claim 11, wherein the MOSFETs of the first inverter circuit are implemented on a fully depleted silicon on insulator (FDSOI) substrate.

* * * * *